United States Patent
Varnica et al.

(10) Patent No.: US 9,256,487 B1
(45) Date of Patent: *Feb. 9, 2016

(54) OPTIMIZING ERROR FLOOR PERFORMANCE OF FINITE-PRECISION LAYERED DECODERS OF LOW-DENSITY PARITY-CHECK (LDPC) CODES

(71) Applicant: Marvell International Ltd., Hamilton (BM)

(72) Inventors: Nedeljko Varnica, San Jose, CA (US); Gregory Burd, San Jose, CA (US); Kiran Gunnam, Milpitas, CA (US)

(73) Assignee: Marvell International Ltd., Hamilton (BM)

(*) Notice: Subject to any disclaimer, the term of this patent is extended or adjusted under 35 U.S.C. 154(b) by 0 days.

This patent is subject to a terminal disclaimer.

(21) Appl. No.: 14/283,718

(22) Filed: May 21, 2014

Related U.S. Application Data

(60) Continuation of application No. 13/610,438, filed on Sep. 11, 2012, now Pat. No. 8,769,382, which is a division of application No. 12/350,052, filed on Jan. 7, 2009, now Pat. No. 8,291,292.

(60) Provisional application No. 61/019,946, filed on Jan. 9, 2008.

(51) Int. Cl.
*H03M 13/00* (2006.01)
*G06F 11/07* (2006.01)
*H03M 13/11* (2006.01)

(52) U.S. Cl.
CPC ......... *G06F 11/073* (2013.01); *H03M 13/1102* (2013.01); *H03M 13/1114* (2013.01)

(58) Field of Classification Search
CPC ................... H03M 13/1102; H03M 13/1114; H03M 13/1131
See application file for complete search history.

(56) References Cited

U.S. PATENT DOCUMENTS

| | | | |
|---|---|---|---|
| 8,291,292 B1 | 10/2012 | Varnica et al. | |
| 2003/0229843 A1* | 12/2003 | Yu et al. | 714/794 |
| 2004/0034827 A1* | 2/2004 | Shen et al. | 714/758 |
| 2004/0268205 A1* | 12/2004 | Stolpman | 714/758 |
| 2005/0078765 A1* | 4/2005 | Jeong et al. | 375/267 |
| 2005/0193320 A1* | 9/2005 | Varnica et al. | 714/800 |
| 2005/0210367 A1* | 9/2005 | Ashikhmin et al. | 714/801 |
| 2005/0229087 A1* | 10/2005 | Kim et al. | 714/800 |
| 2006/0107193 A1* | 5/2006 | Park et al. | 714/801 |

(Continued)

OTHER PUBLICATIONS

Gunnam et al., "Iterative LDPC Solutions for Turbo Equalization," Jul. 2006.

(Continued)

*Primary Examiner* — M. Mujtaba K Chaudry

(57) ABSTRACT

Systems and methods are provided for selecting precisions during iterative decoding with a low-density parity check (LDPC) decoder in order to maximize LDPC code's performance in the error floor region. The selection of the precision of the messages may be done in such a way as to avoid catastrophic errors and to minimize the number of near-codeword errors during the decoding process. Another system and method to avoid catastrophic errors in the layered (serial) LDPC decoder is provided. Lastly, a system and method that select precisions and provide circuitry that optimizes the exchange of information between a soft-input, soft-output (SISO) channel detector and an error correction code (ECC) decoder for channels with memory is provided.

18 Claims, 15 Drawing Sheets

(56) References Cited

U.S. PATENT DOCUMENTS

2008/0276156 A1    11/2008    Gunnam et al.
2008/0301521 A1    12/2008    Gunnam et al.

OTHER PUBLICATIONS

Gunnam et al., "Value-Reuse Properties of Min-Sum for GF(q)," Texas A&M Note, report dated Oct. 2006. Available for unrestricted access since Jul. 2008. Published around Aug. 2010.

Gunnam et al., excerpt "Word Length Analysis for LDPC Decoders," Texas A&M Univeristy Technical Note Draft, 2006.

Kavcic, Aleksander et al. "Binary Intersymbol Interference Channels: Gallager Codes, Density Evolution and Code Performance Bounds," IEEE Transactions on Information Theory, pp. 100-118, (Feb. 2002).

Luby, Michael G. et al. "Improved Low-Density Parity-Check Codes Using Irregular Graphs," IEEE Transactions on Information Theory, vol. 47, No. 2, pp. 585-598, (Feb. 2001).

Mackay, David J.C. et al. "Weaknesses of Margulis and Ramanujan-Margulis Low-Density Parity-Check Codes," Electronic Notes in Theoretical Computer Science, vol. 74, (2003).

Mansour, Mohammad M. et al. "A 640-Mb/s 2048-Bit Programmable LDPC Decoder Chip," IEEE Journal of Solid-State Circuits, vol. 41, No. 3, pp. 684-698, (Mar. 2006).

Richardson, Thomas J. et al. "The Capacity of Low-Density Parity-Check Codes Under Message-Passing Decoding," IEEE Transactions on Information Theory, vol. 47, No. 2, pp. 599-618, (Feb. 2001).

Richardson, Thomas J. et al. "Design of Capacity-Approaching Irregular Low-Density Parity-Check Codes," IEEE Transactions on Information Theory, vol. 47, No. 2, pp. 619-637, (Feb. 2001).

\* cited by examiner

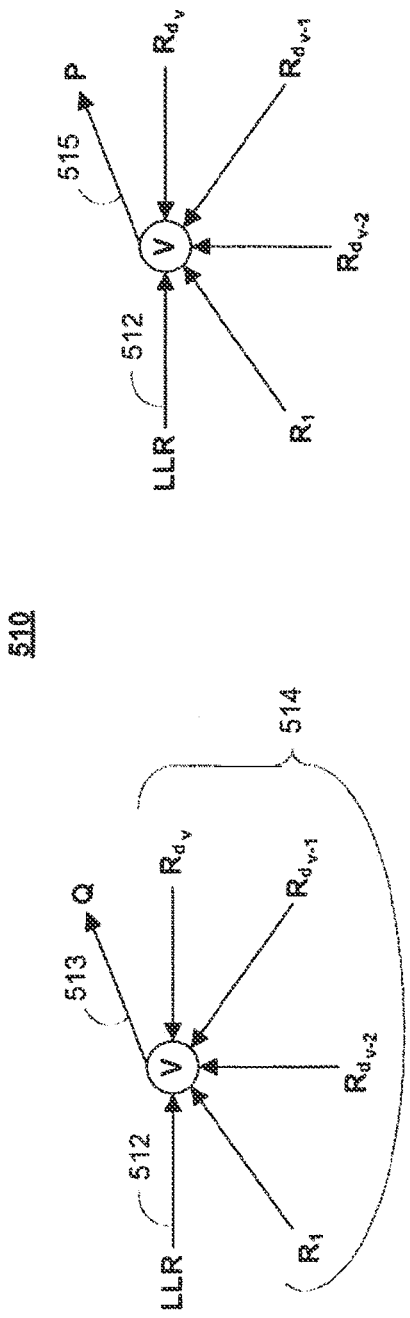
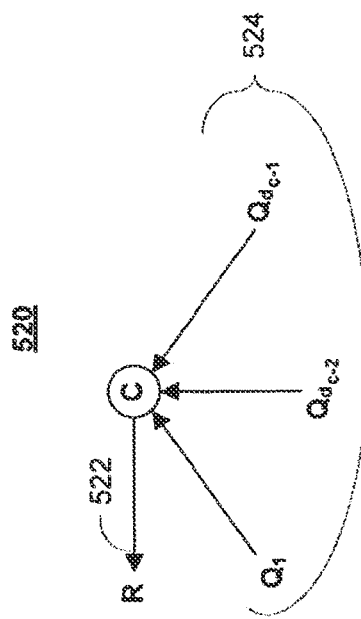
FIG. 5A
FIG. 5B

OPTIMIZING ERROR FLOOR PERFORMANCE OF FINITE-PRECISION LAYERED DECODERS OF LOW-DENSITY PARITY-CHECK (LDPC) CODES

CROSS-REFERENCE TO RELATED APPLICATIONS

This application is a continuation of pending U.S. patent application Ser. No. 13/610,438, filed Sep. 11, 2012, which is a divisional of U.S. patent application Ser. No. 12/350,052 (now U.S. Pat. No. 8,291,292), filed Jan. 7, 2009, which claims the benefit under 35 U.S.C. §119(e) of U.S. Provisional Application No. 61/019,946, filed Jan. 9, 2008, each of which is hereby incorporated by reference herein in its entirety.

BACKGROUND OF THE DISCLOSURE

This disclosure relates generally to data decoding, and more particularly to optimizing error floor performance of finite-precision layered decoders of low-density parity check (LDPC) codes.

With the continuing demand for high-reliability transmission of information in digital communication and storage systems, and with the rapid increase in available computational power, various coding and decoding techniques have been investigated and applied to increase the performance of these systems. One such coding technique, low-density parity check (LDPC) coding, was first proposed in the 1960s, but was not generally used until the 1990s when researchers began to investigate iterative coding and decoding techniques.

LDPC codes are among the few known error control coding techniques capable of transmitting information at a rate close to the Shannon limit or channel-capacity. LDPC codes may be used in the transmission of information on media, or channels, with or without memory. LDPC coding techniques are generally iterative in nature, and may be represented by many different types of parity check matrices. The structure of an LDPC code's parity check matrix may be, for example, random, cyclic, or quasi-cyclic. LDPC codes defined by quasi-cyclic parity check matrices are particularly common and computationally efficient. These codes are known as quasi-cyclic low density parity check (QC-LDPC) codes.

As used herein, "finite precision" refers to a property of an object that signifies that the object either may contain information that may be represented by a finite set of symbols or that the object may perform computations on information represented by a finite set of symbols.

An iterative decoder for use with channels without memory may include an error correcting code (ECC) decoder. In performing decoding, the information from the channel may be passed to the ECC decoder for use in the decoding operation. An iterative decoder for use with channels with memory may include a soft-input soft-output (SISO) channel detector in addition to the ECC decoder. An iterative decoder may alternate between use of a SISO channel detector and ECC decoder to decode data. The information from an iteration of the SISO channel detector may be passed to the ECC decoder for use in the next ECC decoding iteration, and vice versa. Through this iterative process, data reliability is improved.

An iterative decoder may decode LDPC codes using an iterative message passing algorithm, such as a min-sum decoding algorithm. Such algorithms may decode a received codeword using an iterative process, in which each iteration includes two update steps. In the first update step, messages may be passed from some (or all) check nodes to some (or all) variable nodes, and in the second update step, messages may be passed from some (or all) variable nodes to some (or all) check nodes. The update steps may be scheduled in a serial (layered) or flooding fashion. A layered update schedule may provide similar performance with half the number of iterations as compared to a flooding decoding schedule. Details about a layered decoder can be found in the following reference "A 640-Mb/s 2048-Bit Programmable LDPC Decoder Chip", in IEEE Journal of Solid State Circuits, March 2006. An iterative decoder which uses a layered update schedule for the message passing algorithm may be referred to as a layered iterative decoder.

The performance capability of a coding scheme, such as a LDPC coding scheme, is often described by the code's performance curve. The performance curve is a plot of signal-to-noise ratios (SNR) vs. Bit Error Rate (BER), or Sector Error Rate (SER). The performance curve of LDPC codes generally includes two regions: a waterfall region and an error floor region (see FIG. 6). In the waterfall region, the code's BER or equivalently, SER, decreases rapidly with improvements in SNR. However, in the high SNR operating region, the BER/SER plateaus to an error floor, meaning that further improvements in channel condition would not lead to significantly lower BER/SER.

Messages that are passed in the message passing algorithm, used by the iterative decoder, may be of a finite precision. If the messages passed have insufficient precision or precision that is not optimized, the iterative decoder may have the drawback of producing two types of errors that results in higher error floors, which is highly undesirable. These two types of errors are: 1) near-codeword failures and 2) catastrophic errors also known as propagating errors of propagating failures. Near-codeword failures in iterative decoders that do not use properly selected or optimized message precisions may occur more frequently than they would in iterative decoders that use properly selected or optimized message precisions. Details about near-codeword failures can be found in "Weaknesses of Margulis and Ramanujan-Margulis Low-Density Parity-Check Codes" in Electronic Notes in Theoretical Computer Science 2003. Catastrophic errors may lead to increased BER/SER at high SNR values. Moreover, an increased BER/SER at high SNR values may lead to degraded application performance and/or a lowered data transmission rate.

Many communication channels utilizing iterative encoders and iterative decoders operate in the error floor region of the performance curve of the LDPC code. Due to the fact that error floors tend to be very low, e.g. in some instances the error floor is observed at SER=1e-9, at SER=1e-12, or lower, it might not be feasible to reliably simulate error floor performance of a LDPC code. As a consequence, simulations in the waterfall region are typically relied upon to carry out performance/complexity studies for implementations of iterative decoders using messages. It is important to note, however, that neither the effects of near-codeword failures nor the effects of catastrophic errors are likely to be observed in the waterfall region of the performance curve of a LDPC code. Therefore, iterative decoders that are configured based on the performance curve of the LDPC code in the waterfall region (i.e. BER/SER performance at lower SNRs) may use precisions that may not be appropriate or sufficient for the error floor region of the performance curve of the LDPC code. This can lead to suboptimal implementations of an iterative decoder for LDPC codes.

Iterative decoders which use a message passing algorithm with optimized message precisions (or with a modified decoding update rule) may avoid a high probability for near-codeword failures and may produce fewer catastrophic errors. This may lead to decreased BER/SER at various SNR values. Therefore, it would be desirable to provide layered iterative decoders which use a message passing algorithm with optimized message precisions based on the error floor region of the performance curve of a LDPC code. The increased decoding performance in the error floor region of these types of decoders may lead to improved application performance and/or larger data transmission rates.

SUMMARY OF THE DISCLOSURE

Accordingly, systems and methods are disclosed that provide optimizations in the precision of a-posteriori P type messages computed by the variable nodes and the precision of the Q type messages that are passed from the variable nodes to the check nodes in the message passing algorithm used by the iterative decoder for LDPC codes. Selecting precisions according to this disclosure may provide optimized performance of iterative decoders in the error floor region of the performance curve of a LDPC code.

Embodiments are provided to avoid catastrophic (propagating) errors in the layered iterative decoder. For example, P and/or Q type messages in the layered iterative decoder may be "freezed" as soon as those messages reach their saturation values. As another example, finite precisions for messages in the message passing algorithm used by the iterative decoder may be selected to avoid the catastrophic errors altogether.

Embodiments are also provided for selecting the precision and the maximum magnitudes of the messages passed from a soft-input, soft-output (SISO) channel detector (e.g. a SOVA detector) to the LDPC decoder and from LDPC decoder to SISO channel detector in the detector-decoder combination for channels with memory.

An encoder, in accordance with some embodiments, may encode user information (such as holographic page data or magnetic recording data) using a LDPC code and send this to a modulator to transmit on a channel. The channel may or may not have memory. After transmission on the channel, a demodulator may demodulate the information received from the channel. The received signal (received vector) from the demodulator may contain errors due to channel noise. The signal may then be processed by an iterative decoder.

A finite precision for Q type messages (i.e. the messages sent from variable nodes to check nodes) or P type messages (i.e. the a-posteriori probabilities of variable nodes) may be selected. The precisions may be selected based at least in part on channel type (e.g. channels with memory or channels without memory). The precisions may also be selected based at least in part on the performance of the LDPC code. For example, assuming that the precision of R type messages (i.e. the messages from sent from check nodes to variable nodes) may be given or already selected (e.g. based on the hardware complexity limitations), selecting a different precision of the Q type and/or P type messages may be done in order to preferably optimize the performance of an LDPC code in the error floor region of its performance curve. The layered iterative decoder may then use the message passing algorithm with the selected finite precisions for check nodes and variable nodes messages to process the received vector.

In some embodiments, such as in channels without memory, the precision of R type messages, $P_R$, may be first selected or optimized, and then the precision of the computed a-priori LLRs ($P_{LLR}$) may be selected. In order to substantially eliminate catastrophic (propagating) errors, the precision of P type messages may be set to: $P_P = \text{ceil}(\log_2(cw \cdot 2^{P_R} + 2^{P_{LLR}}))$, where cw is the largest column weight in the LDPC parity check matrix. Moreover, if the message passing algorithm update steps are scheduled so that Q type messages are stored in memory, the precision of Q type messages may be set to: $P_Q = \text{ceil}(\log_2((cw-1) \cdot 2^{P_R} + 2^{P_{LLR}}))$ Selecting the precisions of messages in this way may ideally avoid catastrophic errors. It may also reduce the occurrence of near-codeword failures, which may be a dominating factor in the performance of a LDPC code in the error floor region.

In some embodiments, such as in channels with memory, a precision for P type and Q type messages, $P_P$ and $P_Q$ respectively, may be chosen together with the precision of the LLRs received from a channel detector (i.e. S type messages with precisions $P_S$), and/or together with the precision of output messages from the ECC decoder back to the channel detector (i.e. Le type messages). For iterative decoders used in channels with memory, the precision of S type messages ($P_S$) may be reduced, if desired. There may be a gain or loss in the performance of the LDPC code due to this reduction. Reducing $P_S$ may, however, mitigate the effects of improper LLRs (such as defect LLRs, for example) that may be produced by a channel detector (e.g. due to defects present in the received vector).

For example, the precision of R type messages may first be selected or optimized; the precision of Le type messages may be set to $P_{Le} = P_R + \text{ceil}(\log_2(cw))$, and the precision of S type messages, $P_S$, may be set. For example, this precision may be set so that $P_S \leq P_{Le}$ Then, the precision of P type messages may be set to: $P_P = \text{ceil}(\log_2(cw \cdot 2^{P_R} + 2^{P_S}))$ and the precision of Q type messages may be set to: $P_Q = \text{ceil}(\log_2((cw-1) \cdot 2^{P_R} + 2^{P_S}))$. Setting precisions in this way may ideally avoid catastrophic errors are avoided altogether. This may also reduce the occurrence of some near-codeword failures, which may dominate the LDPC code performance in the error floor region.

In another embodiment, the precisions of messages sent between a SISO channel detector and a ECC decoder may be selected and appropriately quantized. More specifically, the range of Le type messages going from the output of the ECC decoder and the input of the SISO channel detector may be confined. Also, the range of $LS_{ext}$ messages going from the SISO channel detector to the ECC decoder may be confined. Depending on implementation, a message that is passed by the ECC decoder to the SISO detector may be either a P type or a $LS_{ext}$ message. However, a message sent from the SISO channel detector to the ECC decoder may be labeled as a extrinsic message, $LS_{ext}$ (a $LS_{ext}$ message may contain new information produced by the SISO channel detector).

Yet another embodiment relates to a layered iterative decoder that "freezes" any P type (and/or Q type) message (i.e. stops the message from changing value) as soon as that message becomes saturated (i.e. there are insufficient bits to hold the information in the message) in the layered iterative decoder. This may result in reducing or entirely eliminating catastrophic (propagating) errors in the layered decoder. P type and/or Q type messages may be set to smaller precisions ($P_P$ and $P_Q$, respectively). For example, $P_P$ may be set so that $P_P < \text{ceil}(\log_2(cw \cdot 2^{P_R} + 2^{P_S}))$, and $P_Q$ may be set so that $P_Q < \text{ceil}(\log_2((cw-1) 2^{P_R} + 2^{P_S})$. More specifically, the precisions for P type messages may be set as $P_P = \text{ceil}(\log_2(cw \cdot 2^{P_R} + 2^{P_S})) - 1$ or $P_P = \text{ceil}(\log_2(cw \cdot 2^{P_R} + 2^{P_S})) - 2$. Setting the precisions of the P type messages in this manner may avoid catastrophic errors if it is possible to freeze the P type messages. However, using reduced precisions, and not freezing the P type messages, may not avoid catastrophic errors.

BRIEF DESCRIPTION OF THE FIGURES

The above and other aspects and advantages of the invention will be apparent upon consideration of the following detailed description, taken in conjunction with the accompanying drawings, in which like reference characters refer to like parts throughout, and in which:

FIG. 5A shows a graphical illustration of update rules for variable nodes in the message passing algorithm in accordance with some embodiments;

FIG. 5B shows a graphical illustration of update rules for check nodes in the message passing algorithm in accordance with some embodiments;

DETAILED DESCRIPTION OF THE DISCLOSURE

Systems and methods are provided for optimizing performance of layered decoders of low-density parity check (LDPC) codes. In applications or devices where information may be altered by interference signals or other phenomena, error correction codes, such as LDPC codes, may provide a measured way to protect information against such interference. As used herein, "information" and "data" refer to any unit or aggregate of energy or signals that contain some meaning or usefulness. Encoding may generally refer to the process of generating data in a manner that facilitates subsequent detection and/or correction of errors in the data, while decoding may generally refer to the counterpart process of detecting and/or correcting the errors. The elements of a coding system that perform encoding and decoding are likewise referred to as encoders and decoders, respectively.

Figure 1:
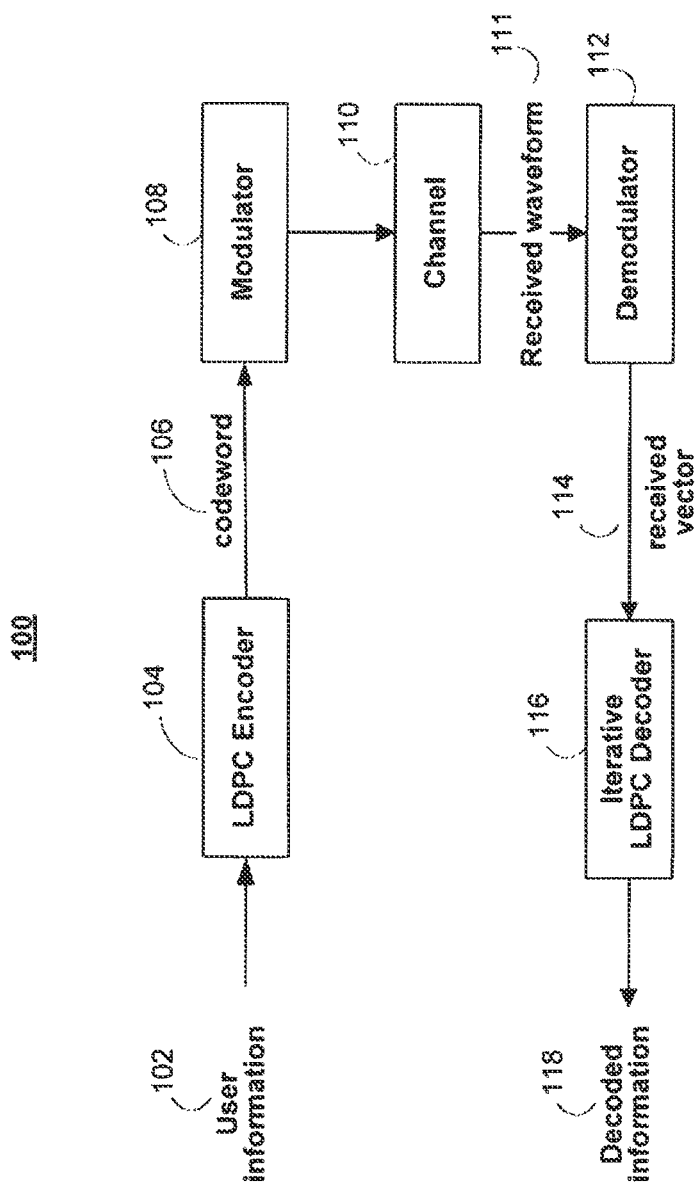
FIG. 1 shows an illustrative block diagram of an error-correcting communication/storage system in accordance with some embodiments.

FIG. 1 shows an illustrative communication or data storage system 100 that utilizes error correction codes for achieving reliable communication or storage in accordance with some embodiments. User information 102 is encoded through encoder 104. User information 102, often referred to as the message information or a message vector, may be grouped into units of k symbols, where each symbol may be binary, ternary, quaternary, or any other suitable type of data. However, for simplicity, embodiments of the present invention will be described in terms of binary bits. In the process of encoding user information 102, different codes may be used by encoder 104 to achieve different results.

As shown in FIG. 1, encoder 104 may encode user information 102 using a low density parity check (LDPC) code. The result of encoding user information 102 is codeword 106, also denoted as c. Codeword 106 may be of a predetermined length, which may be referred to as n, where $n \geq k$.

In one implementation, codeword 106 is passed to a modulator 108. Modulator 108 prepares codeword 106 for transmission on channel 110. Modulator 108 may use phase-shift keying, frequency-shift keying, quadrature amplitude modulation, or any suitable modulation technique to modulate codeword 106 into one or more information-carrying signals. Channel 110 may represent media through which the information-carrying signals travel. Channel 110 may be an asymmetric or symmetric channel. Channel 110 may have memory or may not have memory. For example, channel 110 may represent a wired or wireless medium in a communication system, or an electrical (e.g., RAM, ROM), magnetic (e.g., a hard disk), or optical (e.g., CD, DVD or holographic) storage medium in which the information-carrying signals may be stored.

Due to interference signals and other types of noise and phenomena, channel 110 may corrupt the waveform transmitted by modulator 108. Thus, the waveform received by demodulator 112, received waveform 111, may be different from the originally transmitted signal waveform. Received waveform 111 may be demodulated with demodulator 112. Demodulator 112 may demodulate received waveform 111 with filters, multiplication by periodic functions, or any suitable demodulation technique corresponding to the type of modulation used in modulator 108. The result of demodulation is received vector 114, which may contain errors due to channel corruption.

Received vector 114 may then be processed by iterative decoder 116. Iterative decoder 116 may be used to correct or detect errors in received vector 114. Iterative decoder 116 may use an iterative message passing algorithm to correct or detect errors in received vector 114. The iterative message passing algorithm may use, for example, a error correction code (ECC) decoder. The iterative message passing decoding algorithm may use, for example, a SISO channel detector and an ECC decoder. When utilizing such an iterative algorithm, iterative decoder 116 may perform several iterations of the algorithm until the output of iterative decoder 116 converges to a valid codeword. In some instances, the output of iterative decoder 116 may fail to converge to a valid codeword. Decoder failure may be caused by a variety of reasons. Because the output of iterative decoder 116 may never converge to a valid codeword in certain situations, iterative decoder 116 may be equipped with a maximum iteration limit, which may be any suitable predetermined number. When iterative decoder 116 reaches the maximum iteration limit, iterative decoder 116 may automatically terminate operation and move on to the next received vector 114. However, if the output of iterative decoder 116 successfully converges to a valid codeword, iterative decoder 116 may then output decoded information 118.

Figure 2A:
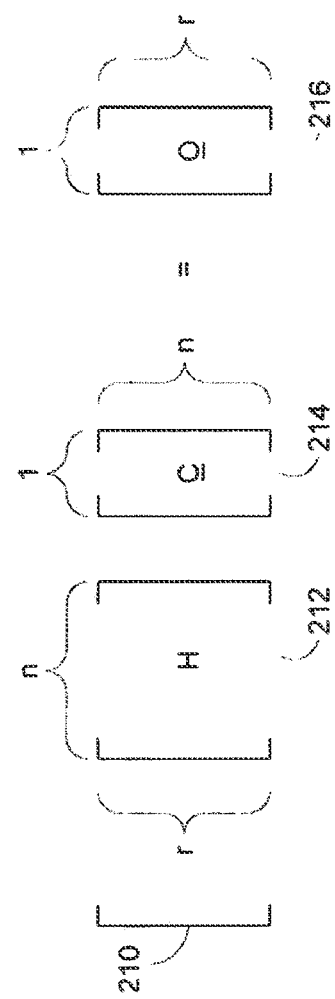
FIG. 2A shows an illustrative example of the properties of a codeword in accordance with some embodiments.

FIG. 2A shows an illustrative example of the properties of codeword 106 of FIG. 1 in accordance with some embodiments. The LDPC codes processed by encoder 104 of FIG. 1 and iterative decoder 116 of FIG. 1 are conventionally represented by mathematical vector models. In particular, an LDPC code may be described by its parity check matrix H. Equation 210 illustrates parity check matrix 212. Parity check matrix 212 may be of size [r×n], corresponding to codewords of length n and syndromes of length r. Codewords may be, for example, n-length codeword 106 or n-length received vector 114 of FIG. 1. Syndrome length r may satisfy the inequality r≥n−k and where k is the length of the information being encoded (e.g., length of user information 102 of FIG. 1). When parity check matrix 212 is multiplied by codeword 214, the result is zero-vector 216, which is a vector of size [r×1] where all elements equal zero. Parity check matrix 212 has a maximum column weight (cw) defined to be the maximum of the set of the number of nonzero entries in each column of parity check matrix 212. Parity check matrix 212 is not unique, and may be chosen, for example, to be computationally convenient and/or to decrease the number of errors of the ECC decoder used by the message passing algorithm in iterative decoder 116 of FIG. 1. As discussed in relation to FIG. 1, codeword 214 may be decoded in iterative decoder 116 of FIG. 1 to produce decoded information 118 of FIG. 1.

Figure 2B:
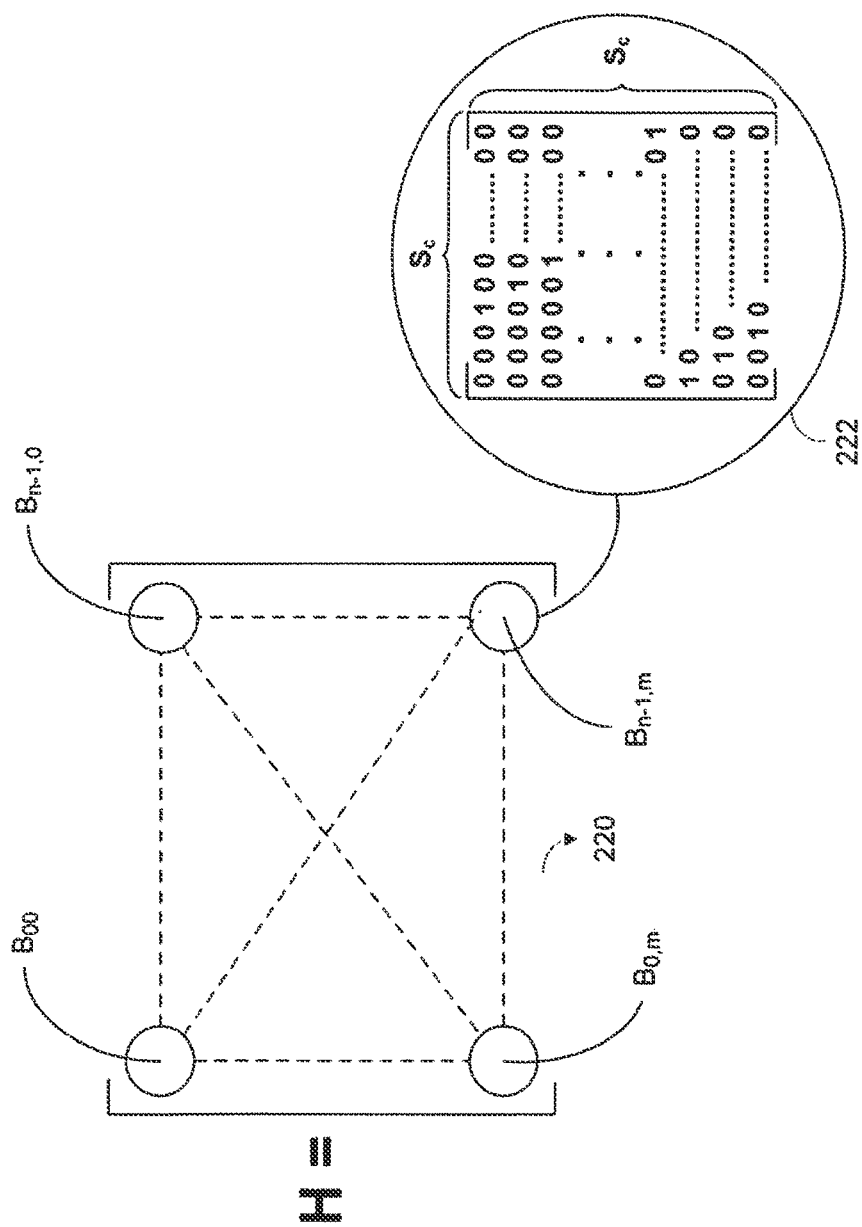
FIG. 2B shows an illustrative example of a quasi-cyclic parity check matrix in accordance with some embodiments.

FIG. 2B shows an illustrative example of quasi-cyclic parity check matrix 220 in accordance with some embodiments. In hardware implementations of low-density parity check codes, it may be desirable for storage and processing to have quasi-cyclic code representations. A quasi-cyclic code representation is defined by the characteristic that the parity check matrix for that particular code is quasi-cyclic. A quasi-cyclic matrix is made up of circular submatricies known as circulants. Circulant 222 is one such matrix. Circulant 222 is a square matrix—i.e. circulant 222 has the same number of rows as columns. This number is commonly referred to as the circulant size $S_c$. In addition, circulants have the property that for any given positive integer M<$S_c$, any row/column of the circulant matrix may be cyclically shifted by M positions to obtain another row or column. It may be computationally beneficial to represent circulants so that they have the property that the cyclic shift of any row or column by M=1 yields the adjacent row or column. Circulant 222 may be one of many circulants of the same size that comprise the quasi-cyclic parity check matrix 220.

If a quasi-cyclic representation of parity check matrix is used, then the implementation of LDPC encoder 104 of FIG. 1 and the ECC decoder, used by the message passing algorithm in iterative decoder 116 of FIG. 1, may be significantly simplified. One reason for this is that parity check matrix 212 of FIG. 2A may be much easier to store, since only the first row of each circulant matrix needs to be stored in order to generate the entire circulant. Another reason for this is that the storage of the messages used in LDPC decoders may be made compact and that the parallelization in encoder/decoder may be achievable with simple shifting operations since adjacent rows (or adjacent columns) corresponding to the same circulant are simple cyclic shifts of each other.

Figure 3A:
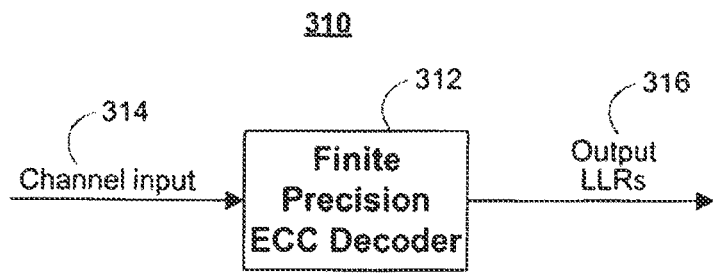
FIG. 3A shows a simplified block diagram of an iterative decoder used for decoding a codeword in channels without memory in accordance with some embodiments.

FIG. 3A shows a simplified block diagram of an iterative decoder that may be used for decoding a codeword in channels without memory in accordance with some embodiments. An iterative decoder for use with channels without memory may include ECC decoder 312. Received vector 114 from channel 110 of FIG. 1 may be passed as channel input 314 to ECC decoder 312 for use in the decoding operation. ECC decoder 312 may calculate a log-likelihood-ratio (LLR) message (also known as soft information). For example, ECC decoder 312 may compute the LLR message using the equation $$LLR(b_i) = \log\left(\frac{P(b_i = 0)}{P(b_i = 1)}\right)$$

for each i, where $b_i$ may represent the $i^{th}$ bit in received vector 114 of FIG. 1. ECC decoder 312 may use the computed LLR messages in the message passing algorithm, which will be discussed further below. ECC decoder 312 may then output LLRs 316 based on the output of the message passing algorithm.

Figure 3B:
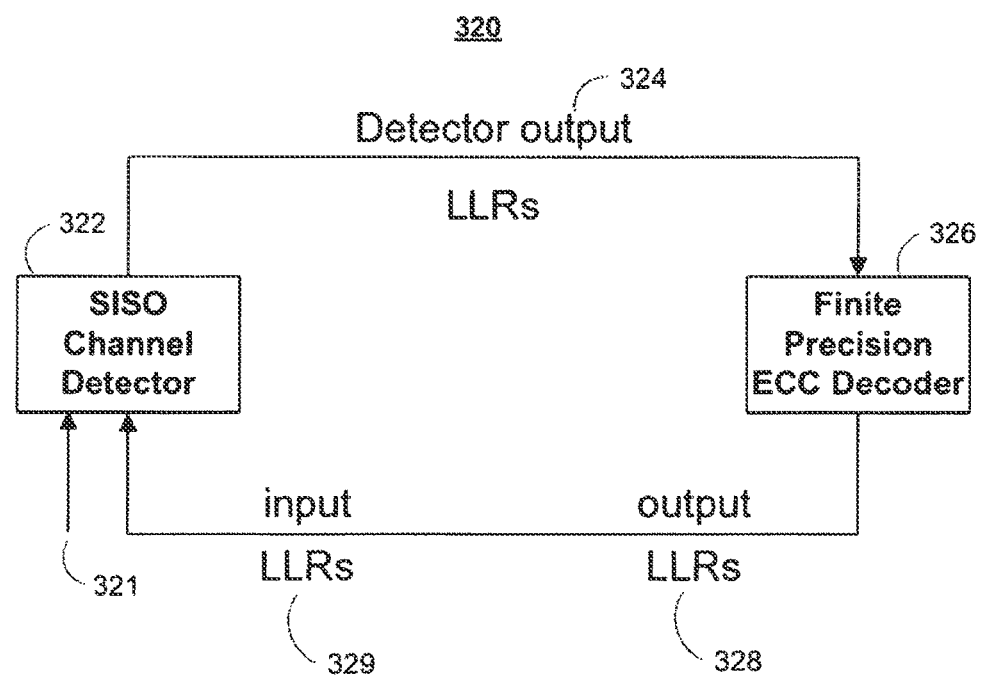
FIG. 3B shows a simplified block diagram of an iterative decoder used for decoding a codeword in channels with memory in accordance with some embodiments.

FIG. 3B shows a simplified block diagram of an iterative decoder used for decoding a codeword in channels with memory in accordance with some embodiments. An iterative decoder for use with channels with memory may include soft-input soft-output (SISO) channel detector 322, and ECC decoder 326. In performing iterative decoding, an iterative decoder may alternate between use of SISO channel detector 322 and ECC decoder 326. The information from an iteration of SISO channel detector 322 may be passed to the ECC decoder 326 for use in the next ECC decoding iteration, and vice versa. Through this iterative process, data reliability may be improved.

In each iteration of the process, received vector 114 from channel 110 of FIG. 1 may be passed as channel input 321 to SISO channel detector 322. SISO channel detector 322 may then use a soft output Viterbi algorithm (SOVA) or a Bahle, Cocke, Jelinek, and Reviv (BCJR) algorithm and channel input 321 to produce detector output LLRs 324 (also referred to as S type messages, or more generally, soft information). Detector output LLRs 324 may then be passed as input to ECC decoder 326 for use in the decoding operation. ECC decoder 326 may use detector output LLRs 324 to compute ECC decoder 326 output LLRs 328 (also referred to as Le type messages). ECC decoder 326 output LLRs 328 may be passed as input LLRs 329 to SISO channel detector 322.

Figure 4:
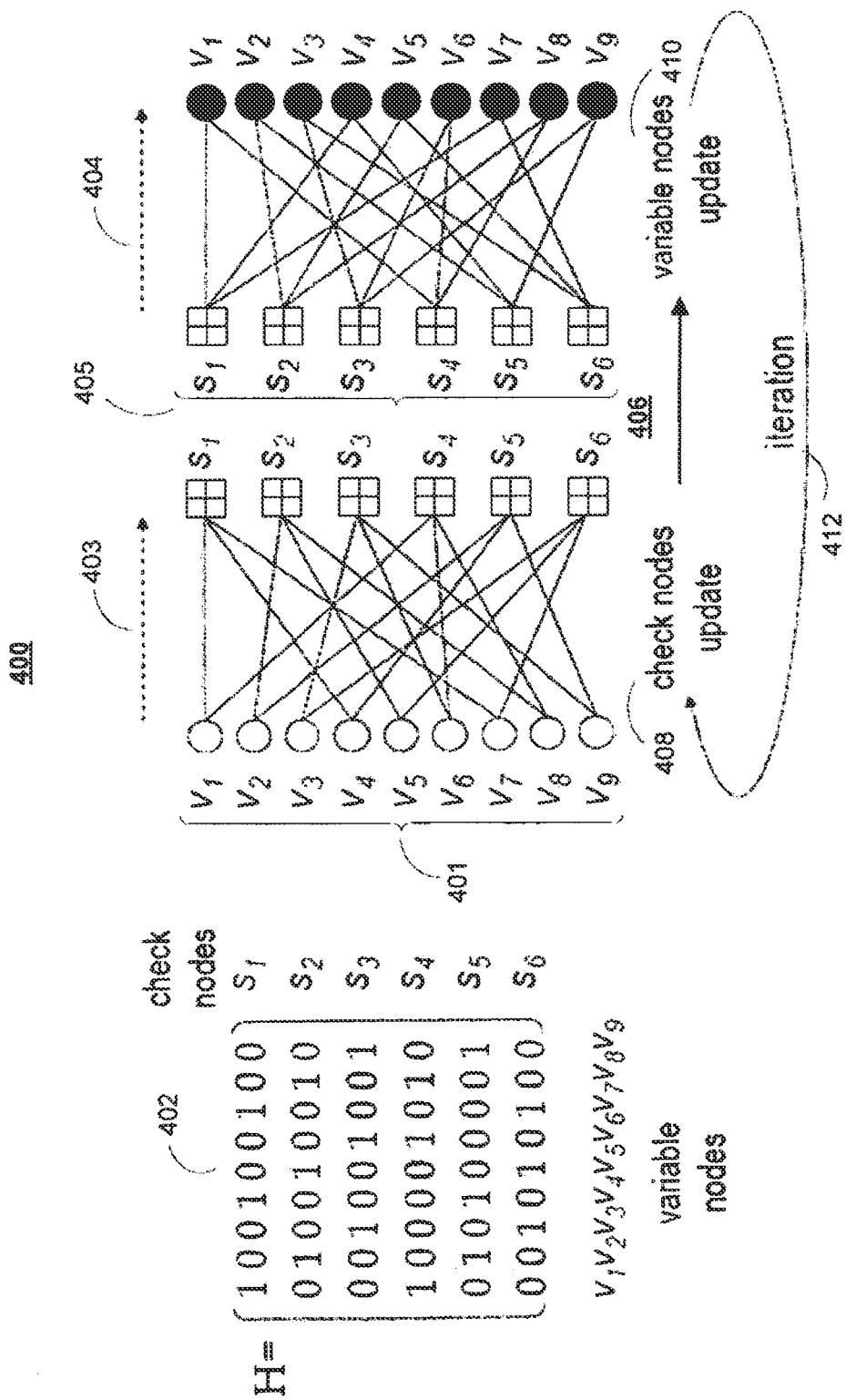
FIG. 4 shows a graphical illustration of a parity check matrix and a message passing algorithm corresponding to the parity check matrix in accordance with some embodiments.

FIG. 4 shows graphical illustration 400 of a parity check matrix and a message passing algorithm corresponding to the parity check matrix in accordance with some embodiments. An LDPC code may be graphically represented by a Tanner graph, a bipartite graph showing the relationship between a LDPC code's codeword bits and syndrome bits. The advantages of using a Tanner graph of a LDPC code may include access to efficient graph-based message passing algorithms for decoding. There are two types of nodes shown in Tanner graphs 403 and 404. Variable nodes 401 represent each position in codeword 106 and are denoted by circles. Thus, there may be n variable nodes. Variable nodes may also be referred to as symbol or bit nodes. Check nodes 405 represent each syndrome (parity check equation) of the LDPC code. For example, there may be n−k check nodes. Check nodes are denoted by squares.

Tanner graphs 403 and 404 correspond to parity check matrix 402. The check nodes and variable nodes of Tanner graphs 403 and 404 may correspond to the rows and columns of parity check matrix 402, respectively. The undirected edges connecting check nodes with variable nodes may correspond to the locations of the non-zero entries of parity check matrix 402. In other words, parity check matrix 402 may be the adjacency matrix of Tanner graphs 403 and 404. For example, the 1 at the (1,1) location and the 0 at the (1,2) location of parity check matrix 402 may indicate that there is an edge between check node $S_1$ and variable node $V_1$, and that there is no edge between check node $S_1$ and variable node $V_2$, respectively. Therefore, if there are $d_v$ "1"'s in a given column of parity check matrix 402, then there are $d_v$ edges emanating from the variable node corresponding to that column. Equivalently, the variable node corresponding to that column may have a degree of $d_v$. Similarly, if there are $d_c$ "1"'s in some given row of parity check matrix 402, then there may be $d_c$ edges emanating from the check node corresponding to that row. Equivalently, the check node corresponding to that row may have a degree of $d_c$.

The check nodes (e.g. check nodes 405) of a Tanner graph may either be satisfied or unsatisfied, where a satisfied node has a binary value of 0 and an unsatisfied node has a binary value of 1. A check node may be satisfied (i.e., equal to 0), if the values of the variable nodes connected to the check node sum to an even number. In other words, the value of each check node may be equal to the sum modulo two of the value of the variable nodes to which it is connected. For example, check node $S_2$ of Tanner graphs 403 and 404 may be satisfied if the values of variable nodes $V_2$, $V_5$, and $V_8$ SUM to an even number. Furthermore, when a check node is unsatisfied, at least one of the variable nodes connected to it may be in error. Thus, the value of the check nodes (or equivalently, the value of the syndrome produced by parity check matrix 402) may provide a parity check on each codeword received by a LDPC decoder (i.e., iterative decoder 116 of FIG. 1), thereby providing error correction capability to communication or data storage system 100 of FIG. 1.

Tanner graphs 403 and 404 may be used to illustrate an iterative two-step decoding algorithm known as message passing algorithm 406 employed by, for example, iterative decoder 116 of FIG. 1. The message passing algorithm may perform several rounds (or iterations) of message updates in accordance with the structure of the Tanner graph associated with the parity check matrix of the LDPC codes to be decoded.

In a layered decoder, one layer of message passing decoding (i.e. each iteration 412 of message passing algorithm 406) may include processing several check nodes. For example, in processing the first layer, some of the check nodes 405 (for example, check nodes $S_1$ and $S_2$) may request that some of variable nodes 401, to which they are connected, send their current messages to these check nodes. Check nodes $S_1$ and $S_2$ may then perform update 408 by carrying out computations based on the messages that they receive and a set of update rules, which will be discussed further below. Then, check nodes S1 and S2 may send their current messages to the variable nodes to which they are connected. The variable nodes connected to check nodes $S_1$ and $S_2$ (i.e. variable nodes $V_1$, $V_4$, $V_7$ and nodes $V_2$, $V_5$ and $V_8$) may then perform update 410 by carrying out computations based on the messages that they receive and a set of update rules, which will be discussed further below.

Then, for example, in processing the second layer, some of the check nodes 405 (for example, check nodes $S_3$ and $S_4$) may request that the variable nodes connected to these check nodes send their current messages to these check nodes. Check nodes $S_3$ and $S_4$ may then perform update 408 by carrying out computations based on the messages that they receive and a set of update rules, which will be discussed further below. Then, check nodes $S_3$ and $S_4$ may send their current messages to the variable nodes to which they are connected. Variable nodes connected to check nodes $S_3$ and $S_4$ (i.e. nodes $V_3$, $V_6$, $V_9$ and nodes $V_1$, $V_6$ and $V_8$) may then perform update 410 by carrying out computations based on the messages that they receive and a set of update rules, which will be discussed further below. The same process may be repeated for check nodes $S_5$ and $S_6$.

Iteration 412 may be repeated until either the codeword has been decoded or until a threshold number of iterations has been reached. The messages that are sent during each step of each iteration of message passing algorithm 406 may depend on the update rules and the scheduling of the update steps, which will be discussed further below. The messages may correspond to log-likelihood-ratio values.

FIG. 5A shows graphical illustration 510 of update rules for variable nodes in message passing algorithm 406 of FIG. 4 in accordance with some embodiments. For decoders operating in channels without memory, prior to the first iteration of message passing algorithm 406, each of the variable nodes 401 of FIG. 4 may compute LLR message 512 based on information from received vector 114 in FIG. 1. For decoders operating in channels with memory, prior to the first iteration of message passing algorithm 406, each of the variable nodes 401 of FIG. 4 may compute LLR message 512 based on information received from SISO channel detector 322 of FIG. 3B.

Each of variable nodes 401 of FIG. 4 may have $d_v$ edges emanating from it in Tanner graphs 403 and 404 of FIG. 4. Each of these edges may connect a variable node to a check node in Tanner graphs 403 and 404 of FIG. 4. For each iteration of the message passing algorithm 406 of FIG. 4, each variable node may receive $d_v$ messages 514 each from a different check node to which it is connected. Each of messages 514 sent from the check nodes to the variable nodes may be labeled as a R type message. For example, these messages are labeled $R_1$ through $R_{d_v}$ in graphical illustration 510.

In the layered iterative decoder, in the first layer, some number of check nodes may be processed and the corresponding neighboring variable nodes are updated. Then in the next layer, the next set of check nodes may be processed and the corresponding variable nodes may be updated. Each layer may be processed in this manner.

There may be several ways to perform (schedule) message update steps in the layered decoder. For example, using initial LLR messages 512, and each of the R type messages 514, each of the variable nodes 401 of FIG. 4 may compute Q type message 513 (also known as a bit-to-check message) based on the equation:

$$Q = LLR + \sum_{j=1}^{d_v-1} R_j.$$

This Q type message may be sent to the check nodes to which the variable node is connected. Similarly, message update steps may be performed to compute P type message 515 (also known as an a-posteriori probability (APP) message). Using initial LRR message 512 and each of the R type messages 514, each of the variable nodes 401 of FIG. 4 may compute a P type message 515 based on the equation:

$$P = LLR + \sum_{j=1}^{d_v} R_j.$$

In addition, each of the variable nodes 401 of FIG. 4 may also compute an extrinsic ($LLR_{EXT}$) message based on the equations:

$$LLR_{APP}(v) = LLR + \sum_{j=1}^{d_v} R_j$$

and $LLR_{EXT}(v) = LLR_{APP}(v) - LLR$. The scheduling of update steps will be discussed further below.

FIG. 5B shows graphical illustrations 520 of update rules for check nodes in message passing algorithm 406 of FIG. 4 in accordance with some embodiments. Each of the check nodes 405 of FIG. 4 may have $d_c$ edges emanating from it in Tanner graphs 403 and 404 of FIG. 4. Each of these edges may connect a check node to a variable node in Tanner graphs 403 and 404 of FIG. 4. For each iteration of the message passing algorithm 406 of FIG. 4, each check node may receive $d_c$ messages 524 each from a different variable node to which it is connected. Messages sent from the variable nodes to the check nodes may be labeled as Q type messages. Depending on the scheduling of the update steps, either Q type messages may be stored in the iterative decoder's memory or P type messages may be stored in the iterative decoder's memory.

Each of the check nodes 405 of FIG. 4 may compute R type message 522, using a min approximation. Using each of the Q type messages 524, each of the check nodes 405 of FIG. 4 may compute R type messages 522 based on the equations $$\tanh\left(\frac{R}{2}\right) = \prod_{k=1}^{d_c-1} \tanh\left(\frac{Q_k}{2}\right)$$

which may be approximated using min approximation $$R \approx \min(Q_k, \ldots, Q_{d_c-1}) \prod_{k=1}^{d_c-1} \text{sign}(Q_k).$$

The $Q_k$ messages (i.e. a number k of Q type messages) may be read directly from the memory of the iterative decoder or may be reconstructed. The $Q_k$ messages may be reconstructed from the $P_k$ messages (i.e. a number k of P type messages) and the previous R type messages that may be read from the memory of the iterative decoder. These newly computed R messages may be sent to each of the variable nodes to which the check node is connected.

Figure 6:
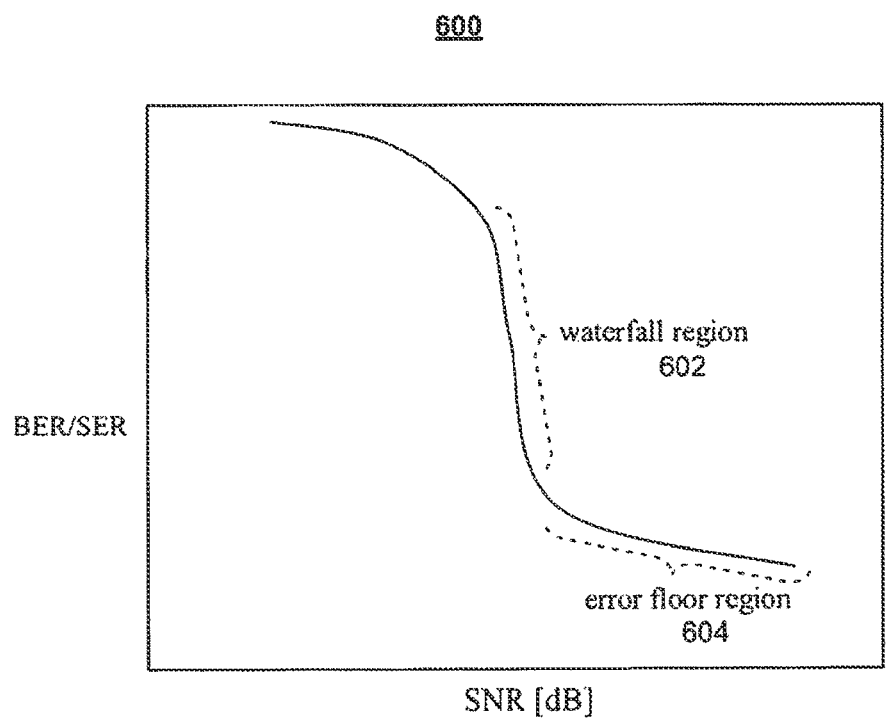
FIG. 6 shows an illustrative graph of regions of error at various signal to noise ratios in accordance with some embodiments.

FIG. 6 shows an illustrative graph of regions of error at various signal-to-noise-ratios (SNRs) in accordance with some embodiments. As mentioned previously, the performance capability of LDPC codes, as described by a mapping of BER/SER to SNR, generally comprises two regions of operation: the waterfall region and the error floor region. FIG. 6 shows an exemplary LDPC performance curve 600 with waterfall region 602 and error floor region 604. In error floor region 604, the BER/SER of the LDPC code disadvantageously asymptotes to a lower limit. Because the normal operating conditions for a communication/storage channel may be in error floor region 604, lowering the error floor may improve the performance of the LDPC code in terms of BER/SER. Appropriately selecting the precision of messages sent during the use of message passing algorithm 406 of FIG. 4 may lower the error floor. Therefore, appropriately selecting the precision of messages sent during the use of message passing algorithm 406 of FIG. 4 may improve the performance of the LDPC code in terms of BER/SER.

Figure 7:
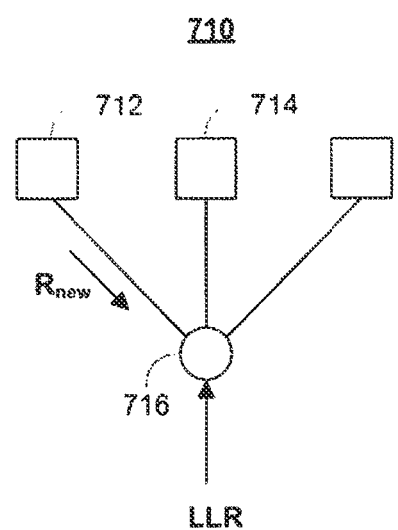
FIG. 7 shows a graphical illustration of the scheduling of update steps of the iterative layered message passing algorithm in accordance with some embodiments.

FIG. 7 shows graphical illustration 710 of the scheduling of update steps of message passing algorithm 406 of FIG. 4 in accordance with some embodiments. In illustration 710, variable node 716 is denoted by a circle. In illustration 710 check node 712 and check node 714 are denoted by squares.

For example, during one part of one iteration of message passing algorithm 406 of FIG. 4, check node 712 may update and send R type message $R_{new}$ (of precision $P_R$) to variable node 716. Check node 712 may use the min approximation, as discussed above, to compute $R_{new}$. Variable node 716 has access to the previous Q type message (of precision $P_Q$) that it had sent to check node 712, in the current iteration, prior to check node 712 updating. Variable node 716 also has access to the previous R type message, $R_{old}$ (of precision $P_R$), sent to it by check node 714 in the previous iteration. After check node 712 has updated, in the current iteration, variable node 716 may compute $Q := Q + R_{new} - R_{old}$ and send this Q type message to check node 714. In one of the subsequent iterations of message passing algorithm 406 of FIG. 4, check node 714 may use this Q type message, the Q type messages received from other variable nodes to which it is connected, and the min approximation, discussed above, to compute a R type message $R_{new}$ (of precision $P_R$) to be sent to variable node 716. Check node 714 may compute R type messages for all other variable nodes to which it is connected, in a similar way.

Each variable node may also update its P type message. For example, after check node 712 has updated, in the current iteration, variable node 716 may compute the a-posteriori probability message $P := P - R_{old} + R_{new}$ (also discussed in FIG. 8). This update may be performed as follows: Variable node 716 may have access to the previous R type message, $R_{old}$ (of precision $P_R$), computed and sent to it by check node 714 in the previous update. Check node 712 may update and send R type message $R_{new}$ (of precision $P_R$) to variable node 716. Check node 712 may use the min approximation, as discussed above, to compute $R_{new}$ from the Q type message reconstructed using $P - R_{old}$ (where $R_{old}$ is the previous R type message received from variable node 716). After check node 712 has updated, variable node 716 may compute $P := Q + R_{new}$ and store this P type message (see FIG. 8). In one of the subsequent layers of iterative decoding, check node 714 then may use this P type message, the P type messages received from other variable nodes (to which it is connected), and the corresponding $R_{old}$ messages, to reconstruct the Q type messages using $P - R_{old}$. Check node 714 may then use the min approximation, discussed above, to compute a R type message $R_{new}$ (of precision $P_R$) to be sent to variable node 716. Similarly, check node 714 may compute R type messages for all other variable nodes to which it is connected.

Figure 8:
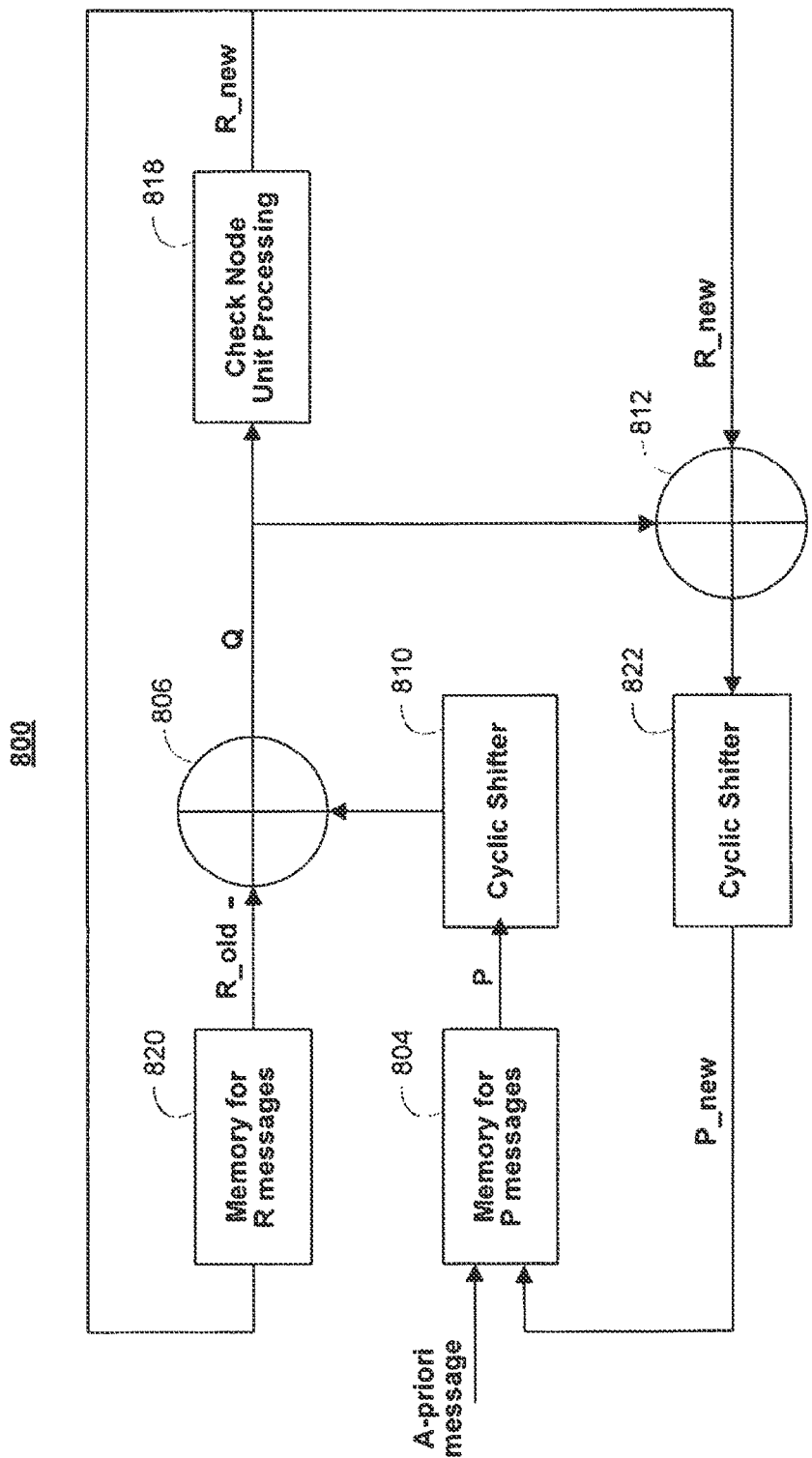
FIG. 8 shows a simplified block diagram of a serial (layered) decoder processing unit used in an iterative in accordance with some embodiments.

FIG. 8 shows a simplified block diagram of serial (layered) decoder processing unit 800 used in iterative decoder 116 of FIG. 1 in accordance with some embodiments. Processing unit 800 may be used to implement each layer of each iteration of the layered update steps in message passing algorithm 406 of FIG. 4. Processing unit 800 may include memory 804 to store P type messages, cyclic shifter 810 which may be used to cyclically shift the bits of the P type messages, adder 812 and subtractor 806, cyclic shifter 822 which may be used to cyclically shift the bits output from adder 812, check node processing unit 818 (also known as check node unit (CNU) 818), and memory 820 to store R type messages. The ECC decoder used by message passing algorithm 406 of FIG. 4 may include a plurality of check node units (CNUs), for example, one check node unit (CNU) per check node in the Tanner graph associated with the LDPC code being used. For example, if one layer of the ECC decoder includes $S_c$ check nodes, then $S_c$ such CNUs are needed. In some embodiments, processing unit 800 may be used to implement the process described in FIG. 7. For example, processing unit 800 may be used to implement the operation given by the equation P:=P+$R_{new}$−$R_{old}$. A similar processing unit may be used to implement the operation Q:=Q+$R_{new}$−$R_{old}$.

The a-priori message in FIG. 8 refers to (LLR) messages produced from the output of the channel or the output of a SISO channel detector (e.g. SISO channel detector 322 of FIG. 3B). In some embodiments, memory 804 may initially store the LLR messages derived from, for example, the output of channel 110 of FIG. 1. In other embodiments, memory 804 may initially store the LLR messages derived from SISO channel detector, for example, the SISO extrinsic messages ($LS_{ext}$ message in FIG. 10). Each P type and/or Q type message corresponds to a particular variable node in the Tanner graph associated with the LDPC code being used. The LLR messages are read initially from memory 804. The output of memory 804 may be input to cyclic shifter 810, which may shift the bits contained in the output of memory 804 appropriately according to a quasi-cyclic LDPC parity check matrix (e.g. matrix 220 of FIG. 2B) associated with the LDPC code being used in message passing algorithm 406 of FIG. 4. Cyclic shifter 810 may then output the shifted bits to subtractor 806.

Subtractor 806 may also have input $R_{old}$, which, which, as described in FIG. 7, represents the R type message previously computed by the check node in the previous update. For each variable node connected to this the check node represented by CNU 818, subtractor 806 may initially calculate and output Q:=LLR upon the first iteration of message passing algorithm 406 of FIG. 4 and Q:=P−$R_{old}$ upon each subsequent iteration. The output of subtractor 806 may be input to check node processing unit 818 (CNU 818). CNU 818 may then compute and output R type message $R_{new}$ using as input the Q type messages from subtractor 816 and the min approximation, as discussed above and in FIG. 7. CNU 818 may then output the computed $R_{new}$ message as input to adder 812. Adder 812 may also have as input the Q type messages from subtractor 816. Adder 812 may then calculate and output the value of $R_{new}$ added to the output of subtractor 806 into the input cyclic shifter 822. Cyclic shifter 822 may shift the bits of its input appropriately according to the quasi-cyclic parity check matrix (e.g. matrix 220 of FIG. 2B) being used in message passing algorithm 406 of FIG. 4 and output the result to the input of memory 804.

One cause of catastrophic errors in layered iterative decoders with insufficient precision of P type and/or Q type messages may relate to a "swing" in R type messages. During an update of an R type message in layered iterative decoder (e.g. within processing unit 800), the computed difference of R type messages, ($R_{new}$−$R_{old}$), also referred to as a "swing" in R type messages, may represent a significant portion of (or even exceed) the magnitude of a P type message (which may have already been truncated). Furthermore, the P type message and ($R_{new}$−$R_{old}$) may have opposite signs. For decoders with sufficient precision, however, the difference of R type messages, ($R_{new}$−$R_{old}$), may actually be a small portion of the magnitude of the P type message. This may mean that in layered iterative decoders with insufficient precision for the P type message, the result of computing P−$R_{old}$+$R_{new}$ may be significantly different than the result of computing P−$R_{old}$+$R_{new}$ in layered iterative decoders that do not impose any limitation on the precision of intermediate messages. Similarly, in layered iterative decoders with insufficient precision for a Q type message, the result of Q−$R_{old}$+$R_{new}$ may be significantly different than the results of computing Q−$R_{old}$+$R_{new}$ in layered iterative decoders with larger or sufficient precisions for the Q type message.

In other words, a problem in layered iterative decoders with insufficient precision of P type and/or Q type messages is that some P type or Q type messages may become saturated. Furthermore this problem may be complicated by the event of having a large "swing" in the difference of R type messages, ($R_{new}$−$R_{old}$), while having opposite signs between the "swing" in the difference of R type messages and the P type (or Q type) message. Catastrophic errors may occur when this problem occurs on several nodes at substantially the same. Catastrophic errors may propagate through the iterative decoder. These errors may be eliminated via proper selection of the finite precisions of the P type or Q type messages, $P_P$ or $P_Q$, or by a message "freezing" method, described below.

Figure 9:
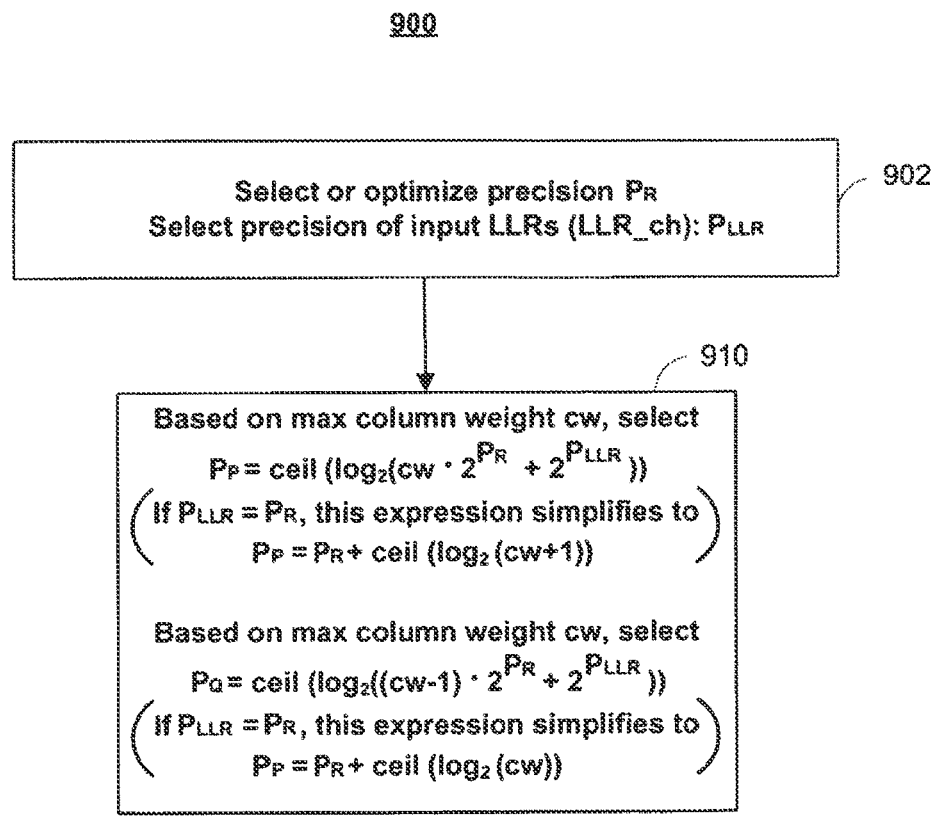
FIG. 9 shows a flowchart of an embodiment of a process for choosing the optimal precision of P and/or Q type messages within the iterative decoder used by the message passing algorithm for decoding a codeword in channels without memory in accordance with some embodiments.

FIG. 9 shows a flowchart of a process for choosing the optimal precision of P type and/or Q type messages within iterative decoder 116 of FIG. 1 used by message passing algorithm 406 of FIG. 4 for decoding a codeword in channels without memory in accordance with some embodiments. Process 900 includes steps 902 and 910. In certain embodiments, process 900 is designed to select or optimize the precision of the messages by iterative decoder 116. For example, process 900 may select or optimize the precision of P type and/or Q type messages given that the precision of R type or LLR messages are already selected (or already optimized).

At step 902, the precision of R type messages ($P_R$) may be selected or optimized. Furthermore, at step 902, the precision of LLR messages ($P_{LLR}$) may be selected.

At step 910, the precision of P type messages ($P_R$) may be set to a bit value. Specifically, the values of $P_R$, $P_{LLR}$, and the maximum column weight, cw, of the parity check matrix associated with the LDPC code may be used to determine the value of $P_P$. This may be done using equation $P_P$=ceil($\log_2$(cw·$2^{P_R}$+$2^{P_{LLR}}$)), which may be simplified to $P_P$=$P_R$+ceil($\log_2$(cw+1)) if $P_R$ is equal to $P_{LLR}$. The selected precisions may be used in every iteration of iterative decoder 116 of FIG. 1. With this selection, the catastrophic errors may be substantially eliminated.

At step 910, the precision of Q type messages ($P_Q$) may also be set. Specifically, the values of $P_R$, $P_{LLR}$, and the maximum column weight, cw, of the parity check matrix associated with the LDPC code may be used to determine the value of $P_Q$. This may be done using equation $P_Q$=ceil($\log_2$((cw−1)·$2^{P_R}$+$2^{P_{LLR}}$)), which may be simplified to $P_Q$=$P_R$+ceil($\log_2$(cw)) if $P_R$ is equal to $P_{LLR}$. With this selection, the catastrophic (propagation) errors may be substantially eliminated.

Figure 10:
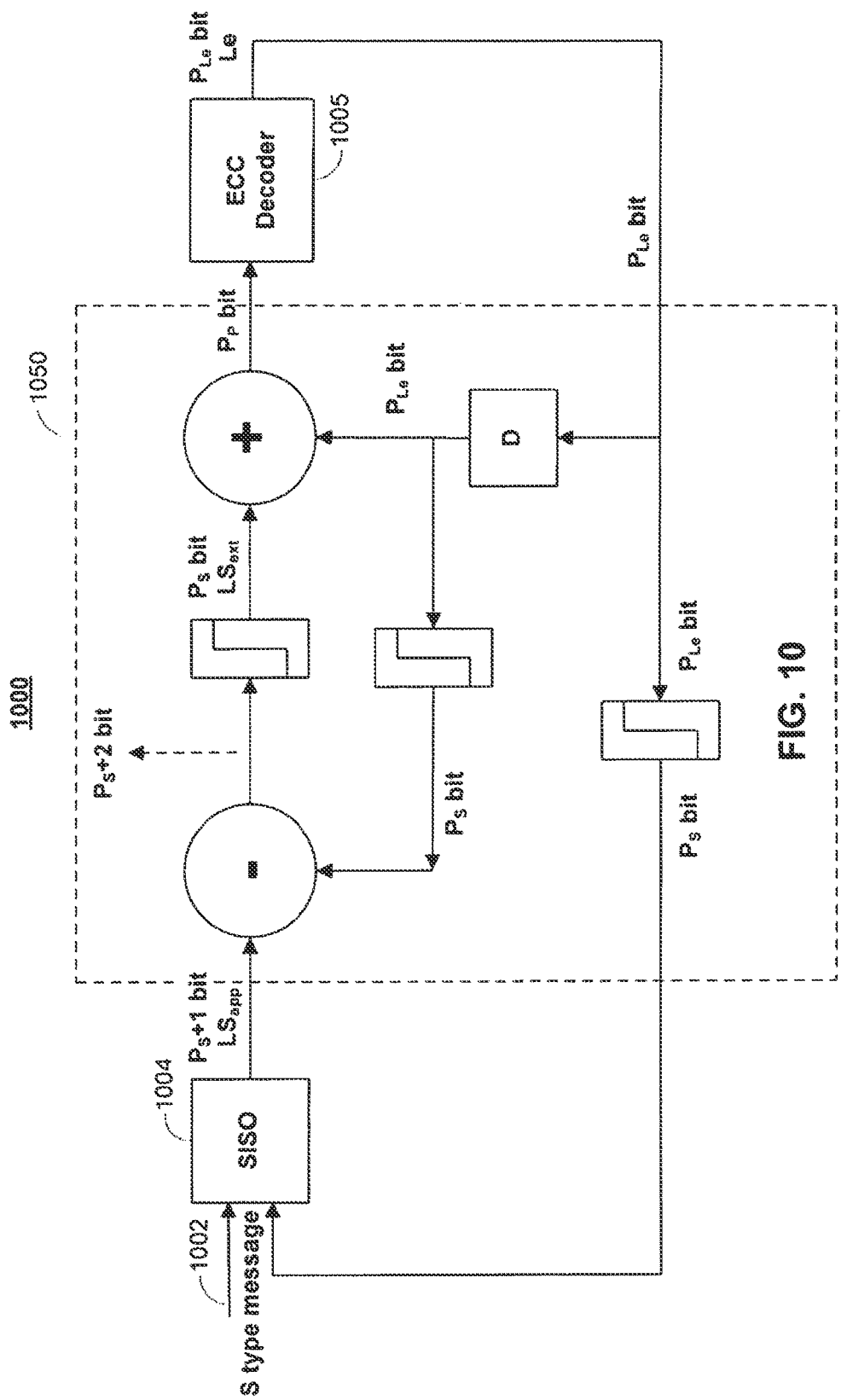
FIG. 10 shows a simplified block diagram of an iterative decoder used for decoding a codeword in channels with memory and precisions of various messages passed within the iterative decoder used by the message passing algorithm in accordance with some embodiments.

FIG. 10 shows a simplified block diagram of iterative decoder 1000 used for decoding a codeword in channels with memory and precisions of various messages passed within iterative decoder 1000 used by message passing algorithm 406 of FIG. 4 in accordance with some embodiments. Iterative decoder 1000 includes SISO channel detector 1004, circuitry 1050, and ECC decoder 1005. In performing iterative decoding, iterative decoder 1000 may alternate between the use of SISO channel detector 1004, and ECC decoder 1005.

Similar to iterative decoder 320, messages from an iteration of SISO channel detector 1004 may be passed to the ECC decoder 1005 for use in the next ECC decoding iteration, and vice versa. However, the precision of the messages sent from SISO channel detector 1004 may be quantized by circuitry 1050 prior to them being input to ECC decoder 1005. Similarly, the precision of the messages sent from ECC decoder 1005 may be quantized prior to them being input to SISO channel detector 1004.

The quantization of SISO a-priori information may be related to the implementation of SISO channel detector 1004. The a-priori message may have a precision $P_S$ bits. For example, this a-priori message may have the same precision as the R type messages in the iterative decoder for LDPC codes, i.e., $P_S=P_R$. SISO channel detector 1004 may produce the a-posteriori SISO message $LS_{app}$ which may be the sum of a-priori information received from ECC decoder 1005 and new extrinsic information $LS_{ext}$ derived by SISO channel detector 1004. Although the information passed from SISO channel detector 1004 to ECC decoder 1005 may be a $LS_{ext}$ message, in some embodiments it may be advantageous to pass a $LS_{app}$ message instead. The $LS_{app}$ message may be computed based on the equation $$LS_{app} = LS_{ext} + \sum_{j=1}^{d_v} R_j.$$

Due to the way in which the $LS_{app}$ message is computed, it may become important to confine the range of the $LS_{ext}$ message to be within the range of the $LS_{app}$ message and to set the range to a predetermined value. If this is not done, then as iterations of message passing algorithm 406 of FIG. 4 progress, the range of the $LS_{ext}$ message may occupy increasingly large portion of the $LS_{app}$ message range. Initially, the P type message in ECC decoder 1005 may take a quantized version of the value of $LS_{app}$. If, however, there is no quantization, the initial P type message in the ECC decoder may be set as $P=LS_{app}$).

The range of the $LS_{ext}$ message may be allowed to occupy a very large portion of the range of the $LS_{app}$ message. Then, given that there may be a saturation of P type messages that may take place during the update of P type messages within ECC decoder 1005 (i.e. $P=(P-R_{old})+R_{new}$), new information from ECC decoder may not be captured by the P type message. This, however, may result in the sub-optimal performance of SISO channel detector 1004. To remedy the situation, SISO channel detector 1004 may confine the range of the $LS_{ext}$ message to be within the range of the $LS_{app}$ message and to a predetermined level using circuitry 1050. This may be accomplished by reconstructing the $LS_{ext}$ message from the $LS_{app}$ message using the equation $LS_{ext}=LS_{app}-Le$, quantizing (clipping) the $LS_{ext}$ message to the desired range, and then obtaining a new, quantized, value for the $LS_{app}$ message using the equation $P=\text{quantized}(LS_{ext})+Le$. These operations may be implemented using the adder, subtractor, clippers, and delay unit in circuitry 1050. This operation assures that information derived by SISO channel detector 1004, as well as information derived by ECC decoder 1005 are properly represented by the P type messages.

Figure 11:
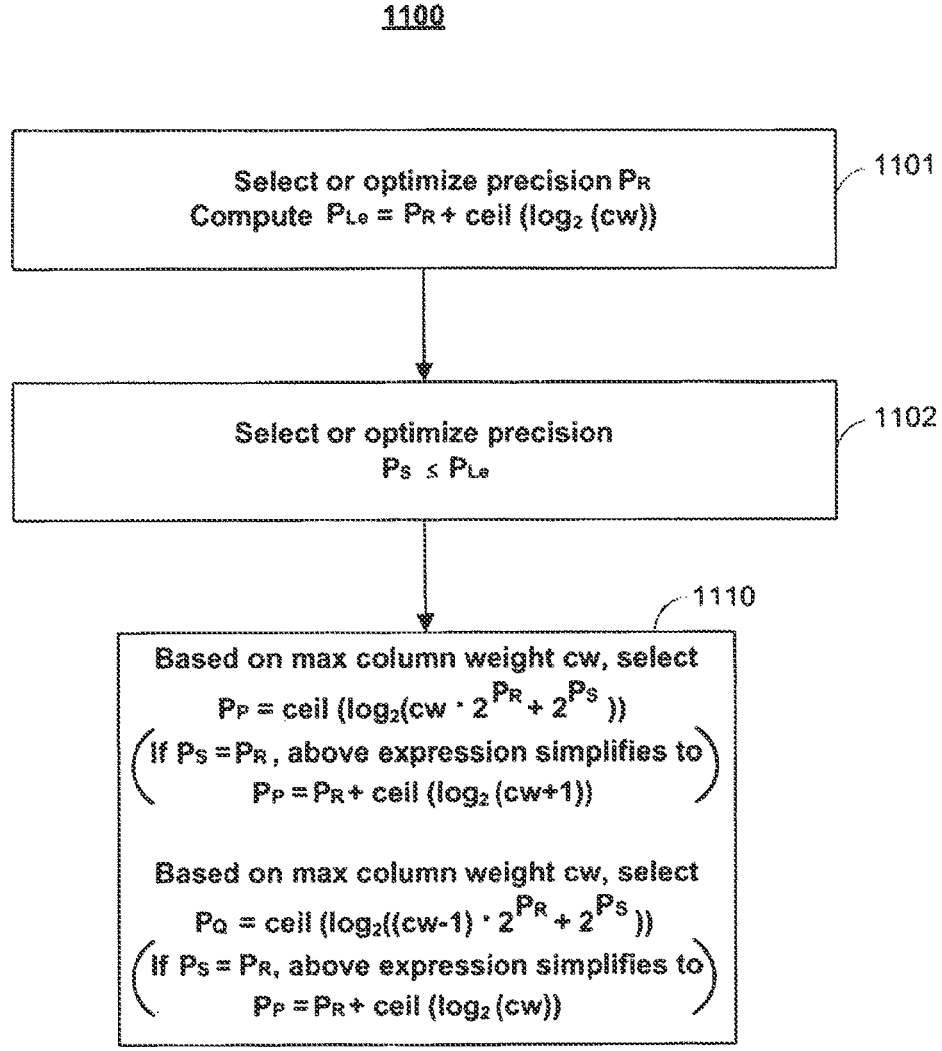
FIG. 11 shows a flowchart of an embodiment of a process for choosing the optimal precision of P or Q type messages within the iterative decoder used by the message passing algorithm for decoding a codeword in channels with memory in accordance with some embodiments.

FIG. 11 shows a flowchart of a process for choosing the optimal precision of P or Q type messages within the iterative decoder 116 of FIG. 1 used by message passing algorithm 406 for decoding a codeword in channels with memory in accordance with some embodiments. Process 1100 includes steps 1101, 1102, and 1110. In certain embodiments, process 1100 may be designed to select or optimize the precision of the messages computed or passed by iterative decoder 116 of FIG. 1. For example, process 1100 may select or optimize the precision of P type messages and/or Q type messages by setting, selecting or optimizing the precision of R type messages, S type messages, and/or Le type messages.

At step 1101, the precision of R type messages ($P_R$) may be selected or optimized. In this step, the precision of Le type messages ($P_{Le}$) may be computed using the equation $P_{Le}=P_R+\text{ceil}(\log_2(cw))$. In step 1102, the precision of S type messages ($P_S$) may be selected or optimized such that $P_S \leq P_{Le}$.

At step 1110, the precision of P type messages ($P_P$) may be set. Specifically, the values of $P_R$, $P_S$, and the maximum column weight, cw, of the parity check matrix associated with the LDPC code may be used to determine the value of $P_P$. This may be done using equation $P_P=\text{ceil}(\log_2(cw \cdot 2^{P_R}+2^{P_S}))$, which may be simplified to $P_P=P_R \text{ceil}(\log_2(cw+1))$ if $P_R$ is equal to $P_S$.

At step 1110, the precision of Q type messages ($P_Q$) may also be set. Specifically, the values of $P_R$, $P_S$, and the maximum column weight, cw, of the parity check matrix associated with the LDPC code may be used to determine the value of $P_Q$. This may be done using equation $P_Q=\text{ceil}(\log_2((cw-1) \cdot 2^{P_R}+2^{P_S}))$, which may be simplified to $P_Q=P_R+\text{ceil}(\log_2(cw))$ if $P_R$ is equal to $P_S$. The selected precisions may be used in every iteration of iterative decoder 116 of FIG. 1.

Setting the precision of messages in iterative decoder 116 of FIG. 1 to an appropriate value helps to avoid catastrophic errors in the decoding operation and may reduce the occurrence of near-codeword failures, thus reducing the error floor of the LDPC code's performance curve.

Figure 12A:
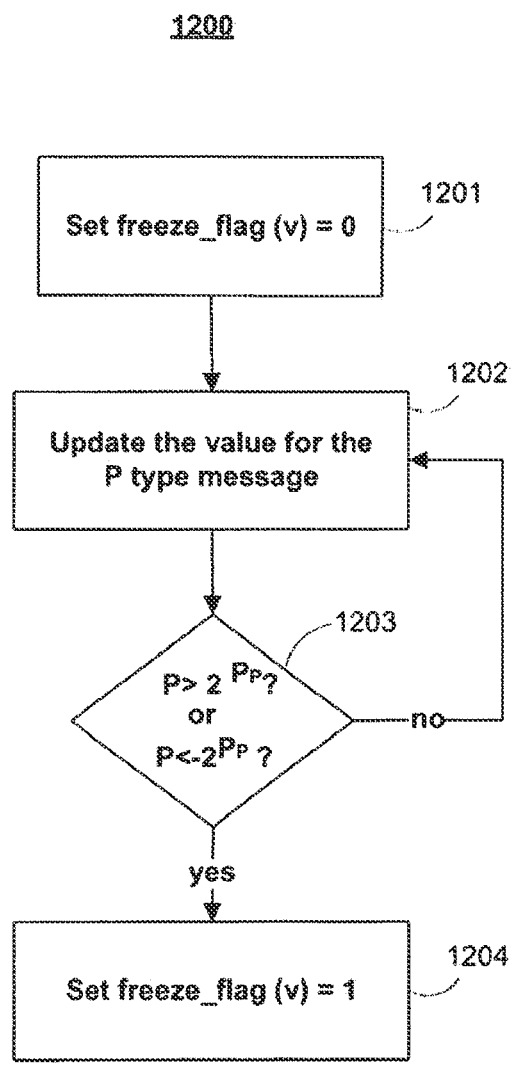
FIG. 12A shows a flowchart of a process for "freezing" a P type message, if it becomes saturated in accordance with some embodiments.

FIG. 12A shows a flowchart of a process for "freezing" a P type message if it becomes saturated in accordance with some embodiments. Process 1200 involves steps 1201, 1202, 1203, and 1204. At the beginning of decoding, for each variable node, step 1201 may be executed. At step 1201, freeze_flag (v) may be set to zero. Next, step 1202 may be executed. At step 1202, process 1200 may wait for the value for the P type message to be updated (e.g. by the update steps in message passing algorithm 406 of FIG. 4 within processing unit 800 of FIG. 8). Next, at step 1203, it is determined if the value of the P type message is greater than $2^{P_P}$ or if the value of the P type message is less than $-2^{P_P}$. This step determines if the magnitude (absolute value) of the P type message is greater than the $2^{P_P}$ bit precision allotted to the P type messages (i.e. the P type message has been saturated/clipped). Next, at step 1204, if the value of the P type message is greater than $2^{P_P}$ or if the value of the P type message is less than $-2^{P_P}$, the freeze_flag(v) may be set to one. Otherwise, step 1202 may be executed.

Figure 12B:
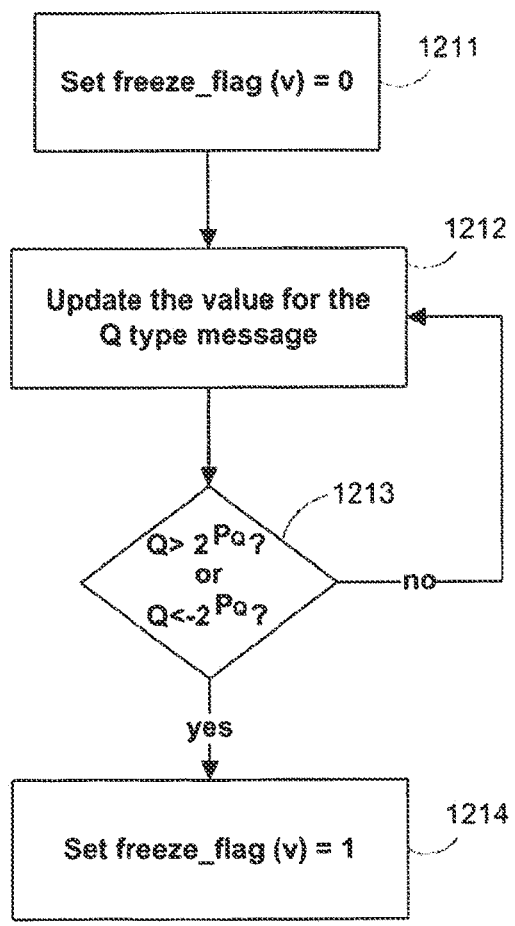
FIG. 12B shows a flowchart of a process for "freezing" a Q type message, if it becomes saturated in accordance with some embodiments.

FIG. 12B shows a flowchart of a process for "freezing" a Q type message, if it becomes saturated in accordance with some embodiments. Process 1210 involves steps 1211, 1212, 1213, and 1214. At the beginning of decoding, for each variable node, step 1211 may be executed. At step 1211, freeze_flag(v) may be set to zero. Next, step 1212 may be executed. At step 1212, process 1210 may wait for the value for the Q type message to be updated (e.g. by the update steps in message passing algorithm 406 of FIG. 4 within processing unit 800 of FIG. 8). Next, at step 1213, it is determined if the value of the Q type message is greater than $2^{P_Q}$ or if the value of the Q type message is less than $-2^{P_Q}$. This step determines if the magnitude (absolute value) of the Q type message is greater than the $2^{P_Q}$ bit precision allotted to the Q type messages (i.e. the Q type message has been saturated/clipped) Next, at step 1214, if the value of the Q type message is greater than $2^{P_Q}$ or if the value of the Q type message is less than $-2^{P_Q}$, the freeze_flag(v) may be set to one. Otherwise, step 1212 may be executed.

Figure 12C:
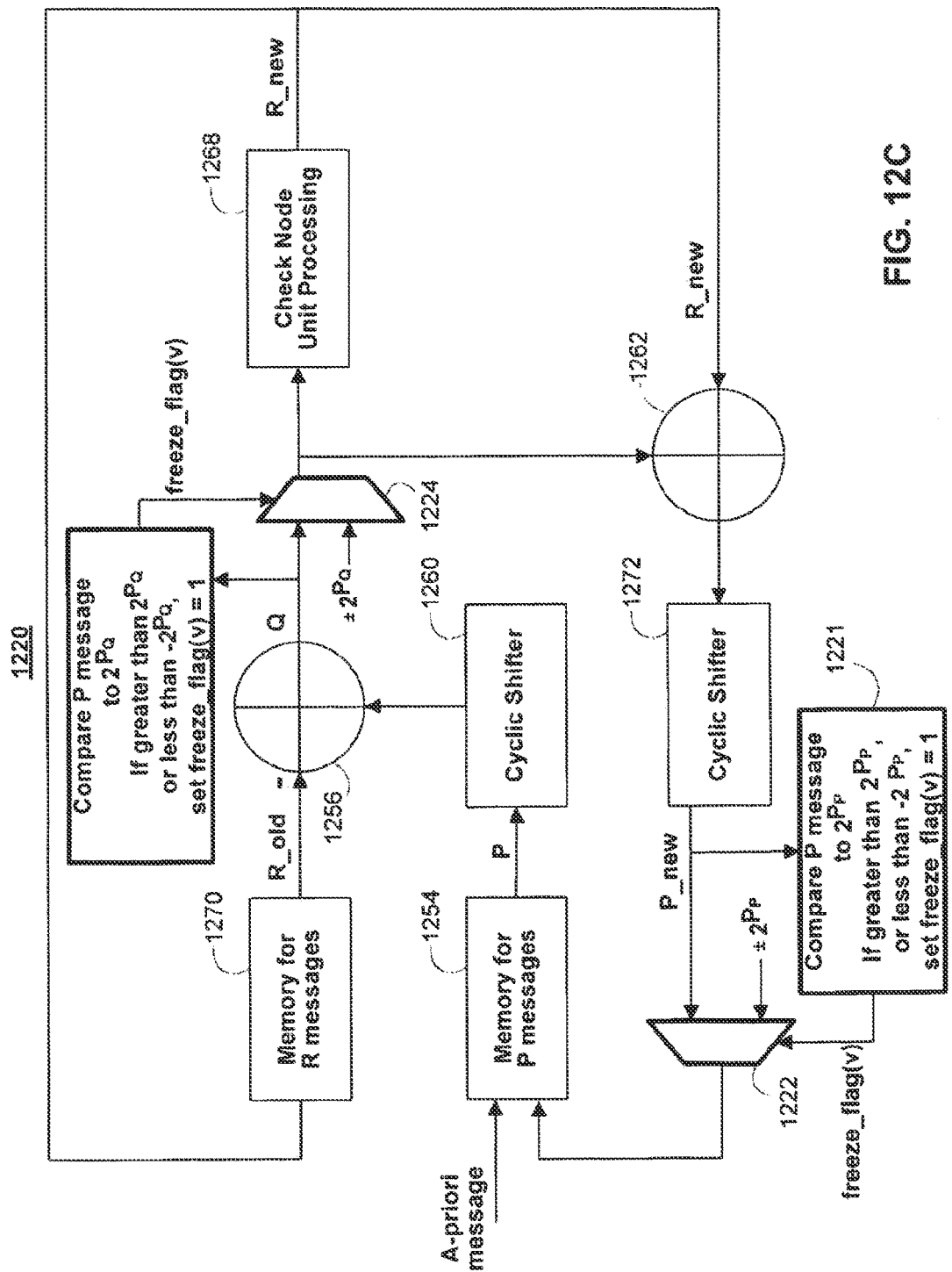
FIG. 12C shows a simplified block diagram of serial (layered) decoder processing unit 1220 used in an iterative decoder with additional "message freezing" hardware in accordance with some embodiments.

FIG. 12C shows a simplified block diagram of serial (layered) decoder processing unit 1220 used in iterative decoder 116 of FIG. 1 with additional "message freezing" hardware in accordance with some embodiments. Processing unit 1220 may be used to implement each layer of each iteration of a check node unit (CNU) update steps in the layered message passing algorithm 406 of FIG. 4. As with processing unit 800 of FIG. 8, processing unit 1220 may include memory 1254 to store P type messages, cyclic shifter 1260 which may be used to cyclically shift the bits of the P type messages, adder 1262 and subtractor 1256, cyclic shifter 1272 which may be used to cyclically shift the bits output from adder 1262, check node processing unit 1268 (CNU 1268), and memory 1270 to store R type messages. These elements may be substantially similar to memory 804 of FIG. 8, cyclic shifter 810 of FIG. 8, adder 812 of FIG. 8 and subtractor 806 of FIG. 8, cyclic shifter 822 of FIG. 8, check node processing unit 818 of FIG. 8 (CNU 818 of FIG. 8), and memory 820 of FIG. 8. However, processing unit 1220 may also include circuit block 1221, selector 1222, circuit block 1223, and selector 1224. This additional hardware may allow for the "freezing" of a P type or Q type message, if either becomes saturated. This "message freezing approach" may be used for channels with or without memory.

Circuit block 1221 may include hardware to implement process 1200 of FIG. 12A. Selector 1222 may have as input, the output of free_flag(v) from circuit block 1221 for each variable node. Selector 1222 may also have as input the output of cyclic shifter 1272 and the value $\pm 2^{P_P}$. If, free_flag(v)=1 in circuit block 1221, then selector 1222 may select the value $\pm 2^{P_P}$ to output to memory 1254 for the current variable node and for the current iteration of message passing algorithm 406 of FIG. 4 as well as for each subsequent iteration. Therefore, if free_flag(v)=1 for a particular variable node, the decoded value (i.e. the hard decision) on this node may be frozen and no updates may be performed on the P type messages for this variable node. If, free_flag(v)=0 in circuit block 1221, then selector 1222 may output the output of cyclic shifter 1272 to memory 1222 for the current iteration. The sign of $+2^{P_P}$ output to memory 1254 by selector 1222 may be the same as the sign of the current value of the P type message.

Circuit block 1223 may include hardware to implement process 1210 of FIG. 12B. Selector 1224 may have as input, the output of free_flag(v) from circuit block 1223 for each variable node. Selector 1222 may also have as input the output of subtractor 1256 and the value $\pm 2^{P_Q}$. If, free_flag(v)=1 in circuit block 1223, then selector 1224 may select the value $\pm 2^{P_Q}$ to output to CNU array 1268 for the current variable node and for the current iteration of message passing algorithm 406 of FIG. 4 as well as for each subsequent iteration. Therefore, if free_flag(v)=1 for a particular variable node, the decoded value (i.e. the hard decision) on this node may be "frozen" and no updates may be performed on the Q type messages for this variable node. If, free_flag(v)=0 in circuit block 1223, then selector 1224 may output the output of subtractor 1256 to CNU array 1268 for the current iteration. The sign of $\pm 2^{P_Q}$ output to CNU array 1268 by selector 1224 may be the same as the sign of the current value of the P type message.

The ability to "freeze" P type or Q type messages may be useful in situations when the precisions of these messages are not set sufficiently high. For example, the ability to "freeze" the value of a P type message may be useful if the precision of the P type message is chosen to be $P_P < \text{ceil}(\log_2(cw \cdot 2^{P_R} + 2^{P_{LLR}}))$. Otherwise, if $P_P \geq (\log_2(cw \cdot 2^{P_R} + 2^{P_{LLR}}))$, then the P type messages may have sufficient precision and the clipping (saturation) of the P type messages may not occur. Similarly, the ability to "freeze" the value of a Q type message may be useful if the precision of the Q type message is chosen to be $P_Q < \text{ceil}(\log_e(cw \cdot 2^{P_R} + 2^{P_{LLR}}))$. Otherwise, if $P_Q \geq (\log_2(cw \cdot 2^{P_R} + 2^{P_{LLR}}))$, then the Q type messages may have sufficient precision and the clipping (saturation) of Q type messages may not occur.

What is claimed is:

1. A system comprising:
   memory circuitry configured to store check node messages and variable node messages; and
   processing circuitry configured to:
   update a variable node message of stored variable node messages; and
   determine if the variable node message is saturated based on a precision of the variable node message.

2. The system of claim 1, wherein the processing circuitry is further configured to update the variable node message by processing the variable node message based on the check node messages.

3. The system of claim 1, wherein the processing circuitry is further configured to determine if the variable node message is saturated based on determining if the variable node message is greater than 2 raised to a precision of the variable node message or if the variable node message is less than the negative of 2 raised to a precision of the variable node message.

4. The system of claim 1, wherein the processing circuitry is further configured to at least determine if the variable node message is saturated based on determining if $P > 2^{P_P}$ or if $P < -2^{P_P}$, wherein P denotes a magnitude of a P type message and $2^{P_P}$ denotes bit precision allotted to the P type message.

5. The system of claim 1, wherein the processing circuitry is further configured to at least determine if the variable node message is saturated based on determining if $Q > 2^{P_Q}$ or if $Q < -2^{P_Q}$, wherein Q denotes a magnitude of a Q type message and $2^{P_Q}$ denotes bit precision allotted to the Q type message.

6. The system of claim 1, further comprising a plurality of selectors wherein if the variable node message is saturated:
   the processing circuitry is configured to generate an indication that the variable node message is saturated, and
   the selectors are configured to stop future updating of the variable node message.

7. The system of claim 6, wherein each selector of the plurality of selectors is further configured to set the variable node message to a maximum possible value for the variable node message.

8. The system of claim 6, wherein each selector of the plurality of selectors is further configured to set the variable node message to a minimum possible value for the variable node message.

9. The system of claim 1, wherein the variable node message of the stored variable node messages is used to decode information within one of a wireless communication medium, an electrical storage medium, and a magnetic storage medium.

10. A method comprising:
    storing check node messages and variable node messages using memory circuitry;
    updating a variable node message of stored variable node messages based on stored check node messages; and
    determining if the variable node message is saturated based on a precision of the variable node message.

11. The method of claim 10, further comprising updating the variable node message by processing the variable node message based on the check node messages.

12. The method of claim 10, further comprising determining if the variable node message is saturated based on determining if the variable node message is greater than 2 raised to a precision of the variable node message or if the variable node message is less than the negative of 2 raised to a precision of the variable node message.

13. The method of claim 10, further comprising determining if the variable node message is saturated based on determining if $P>2^{P_P}$ or if $P<-2^{P_P}-2^{P_P}$, wherein P denotes a magnitude of a P type message and $2^{P_P}$ denotes bit precision allotted to the P type message.

14. The method of claim 10, further comprising determining if the variable node message is saturated based on determining if $Q>2^{P_Q}$ or if $Q<-2^{P_Q}$, wherein Q denotes a magnitude of a Q type message and $2^{P_Q}$ denotes bit precision allotted to the Q type message.

15. The method of claim 10, further comprising
if the variable node message is saturated:
generating an indication that the variable node message is saturated; and
stopping future updating of the variable node message.

16. The method of claim 15, further comprising setting the variable node message to a maximum possible value for the variable node message.

17. The method of claim 15, further comprising setting the variable node message to a minimum possible value for the variable node message.

18. The method of claim 15, wherein the variable node message of the stored variable node messages is used to decode information within one of a wireless communication medium, an electrical storage medium, and a magnetic storage medium.

* * * * *